(12) United States Patent
Schantz et al.

(10) Patent No.: US 11,561,250 B2
(45) Date of Patent: Jan. 24, 2023

(54) ELECTROSTATIC CHARGE BUILDUP AND ELECTROSTATIC DISCHARGE MONITORING SYSTEM AND METHOD

(71) Applicant: Honeywell Federal Manufacturing & Technologies, LLC, Kansas City, MO (US)

(72) Inventors: Eric T. Schantz, Overland Park, KS (US); Cody William Durand, Kansas City, MO (US); Ryan Michael Soroka, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 6 days.

(21) Appl. No.: 17/342,707

(22) Filed: Jun. 9, 2021

(65) Prior Publication Data

US 2022/0397597 A1 Dec. 15, 2022

(51) Int. Cl.
*G01R 29/12* (2006.01)
*G01R 31/00* (2006.01)

(52) U.S. Cl.
CPC .......... *G01R 29/12* (2013.01); *G01R 31/001* (2013.01)

(58) Field of Classification Search
CPC .............................. G01R 29/12; G01R 31/001
USPC ...................................................... 324/457
See application file for complete search history.

(56) References Cited

U.S. PATENT DOCUMENTS

| 6,658,597 B1 * | 12/2003 | Ker ...................... G06F 11/24 714/E11.154 |
| 8,594,957 B2 | 11/2013 | Gauthier et al. |
| 2008/0075339 A1 * | 3/2008 | Haddad .............. G06V 40/1329 382/124 |

(Continued)

FOREIGN PATENT DOCUMENTS

CN 102213733 10/2011

OTHER PUBLICATIONS

Loh, Chun Ling, and Jeetanshu Shah. "Impact of Pogo Probes on Charge Device Model (CDM) testing of Semiconductor Flip-Chip Packages." 2019 IEEE 21st Electronics Packaging Technology Conference (EPTC). IEEE, 2019. (Year: 2019).*

*Primary Examiner* — Christopher P McAndrew
(74) *Attorney, Agent, or Firm* — Hovey Williams LLP (57) ABSTRACT

A system for monitoring electrostatic charge buildup and electrostatic discharge (ESD) remotely comprises a plurality of electrostatic charge measurement units and a data acquisition device. Each electrostatic charge measurement unit includes a primary charge plate, a static sensor device, a secondary charge plate, and a shielded cable. The primary charge plate is positioned proximal to an object. The static sensor device includes an input sensor at which an electric voltage is measured and outputs an electronic signal whose level varies according to the measured electric voltage. The secondary charge plate is positioned in proximity to the input sensor of the static sensor device. The shielded cable includes an inner conductor electrically connected to the primary charge plate and the secondary charge plate and an outer conductor electrically connected to electrical ground. The data acquisition device receives the electronic signal from the static sensor device of each electrostatic charge measurement unit.

11 Claims, 4 Drawing Sheets

(56) References Cited

U.S. PATENT DOCUMENTS

| | | | |
|---|---|---|---|
| 2010/0165537 A1* | 7/2010 | Maloney | G01R 31/001 361/225 |
| 2012/0283971 A1* | 11/2012 | Anderson | G06F 11/0748 702/65 |
| 2016/0239700 A1* | 8/2016 | Yang | G06V 40/1306 |
| 2017/0161536 A1* | 6/2017 | Lin | G06V 40/1329 |
| 2020/0008417 A1* | 1/2020 | Koziar, Jr. | G01V 3/02 |

* cited by examiner

ELECTROSTATIC CHARGE BUILDUP AND ELECTROSTATIC DISCHARGE MONITORING SYSTEM AND METHOD

STATEMENT REGARDING FEDERALLY-SPONSORED RESEARCH OR DEVELOPMENT

This invention was made with Government support under Contract No.: DE-NA-0002839 awarded by the United States Department of Energy|National Nuclear Security Administration. The Government has certain rights in the invention.

FIELD OF THE INVENTION

Embodiments of the current invention relate to systems and methods for monitoring electrostatic charge buildup and electrostatic discharge.

DESCRIPTION OF THE RELATED ART

Electrostatic charge buildup and electrostatic discharge (ESD) are typically monitored using one or more handheld static sensor devices, each of which includes an input sensor that is exposed to an object to be monitored for changes in electrostatic charge. In order to get an accurate measurement of electrostatic field strength or electric voltage, the static sensor devices must be placed within inches, preferably about 1 inch, from the object. This requirement creates a limitation on the types of environment in which the static sensor devices may be used. For example, hazardous locations, confined spaces, or other hard to reach places may all present challenges for obtaining accurate measurements of electrostatic charges.

SUMMARY OF THE INVENTION

Embodiments of the current invention address one or more of the above-mentioned problems and provide systems and methods for monitoring electrostatic charge buildup and electrostatic discharge (ESD) remotely. Exemplary systems include a primary charge plate that is positioned close to the object to be monitored. The primary charge plate develops a primary electric voltage as a result of the electrostatic charge around, in, or on the object. The primary charge plate is electrically connected to a secondary charge plate through a shielded cable. The secondary charge plate develops a secondary electric voltage which varies according to the primary electric voltage. The secondary charge plate is positioned at an input sensor of a static sensor device which measures the secondary electric voltage. The shielded cable may have a length of a few feet to a few dozen feet in order to allow the static sensor device to measure the electrostatic charge on the object from a remote location.

One embodiment of the system broadly comprises a plurality of electrostatic charge measurement units and a data acquisition device. Each electrostatic charge measurement unit includes a primary charge plate, a static sensor device, a secondary charge plate, and a shielded cable. The primary charge plate is formed from electrically conductive material and is configured to be positioned at a first distance from an object to be monitored for changes in electrostatic charge. The static sensor device includes an input sensor at which an electric voltage is measured. The static sensor device is configured to output an electronic signal whose level varies according to the measured electric voltage. The secondary charge plate is formed from electrically conductive material and is positioned in proximity to the input sensor of the static sensor device. The shielded cable includes an inner electrical conductor and a radially spaced apart isolated outer electrical conductor. The inner electrical conductor is electrically connected to the primary charge plate and the secondary charge plate. The outer electrical conductor is electrically connected to electrical ground. The data acquisition device is configured to receive the electronic signal from the static sensor device of each electrostatic charge measurement unit.

Another embodiment of the system broadly comprises a plurality of electrostatic charge measurement units and a data acquisition device. Each electrostatic charge measurement unit includes a primary charge plate, a static sensor device, a secondary charge plate, a shielded cable, and a grounding cable. The primary charge plate is formed from electrically conductive material and includes a front surface and an opposing back surface. The primary charge plate is configured to be positioned at a first distance from an object to be monitored for changes in electrostatic charge with the front surface facing the object. The static sensor device includes a housing and an input sensor at which an electric voltage is measured. The static sensor device is configured to output an electronic signal whose level varies according to the measured electric voltage. The secondary charge plate is formed from electrically conductive material and is physically attached to the housing of the static sensor device in proximity to the input sensor. The secondary charge plate and the static sensor device are configured to be positioned at a second distance from the object, with the second distance being greater than the first distance. The shielded cable includes an inner electrical conductor and a radially spaced apart outer isolated electrical conductor. The inner electrical conductor is electrically connected to the primary charge plate and the secondary charge plate. The grounding cable includes an inner electrical conductor electrically connected to the outer electrical conductor of the shielded cable and to electrical ground. The data acquisition device is configured to receive the electronic signal from the static sensor device of each electrostatic charge measurement unit.

A method broadly comprises receiving an electrostatic charge with a primary charge plate that creates a primary electric voltage on the primary charge plate, the electrostatic charge generated around, in, or on an object to be monitored for changes in electrostatic charge; receiving a secondary electric voltage on a secondary charge plate, the secondary electric voltage varying according to the primary electric voltage; measuring the secondary electric voltage with a static sensor device; and communicating a level of the secondary electric voltage to a data acquisition device.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Relational terms, such as "above", "below", "upper", "upward", "downward", "lower", "top", "bottom", "outer", "inner", etc., along with orientation terms, such as "horizontal" and "vertical", may be used throughout this description. These terms are used with reference to embodiments of the technology and the positions and orientations thereof shown in the accompanying figures. Embodiments of the technology may be positioned and oriented in other ways. Therefore, the terms do not limit the scope of the current technology.

Figure 1:
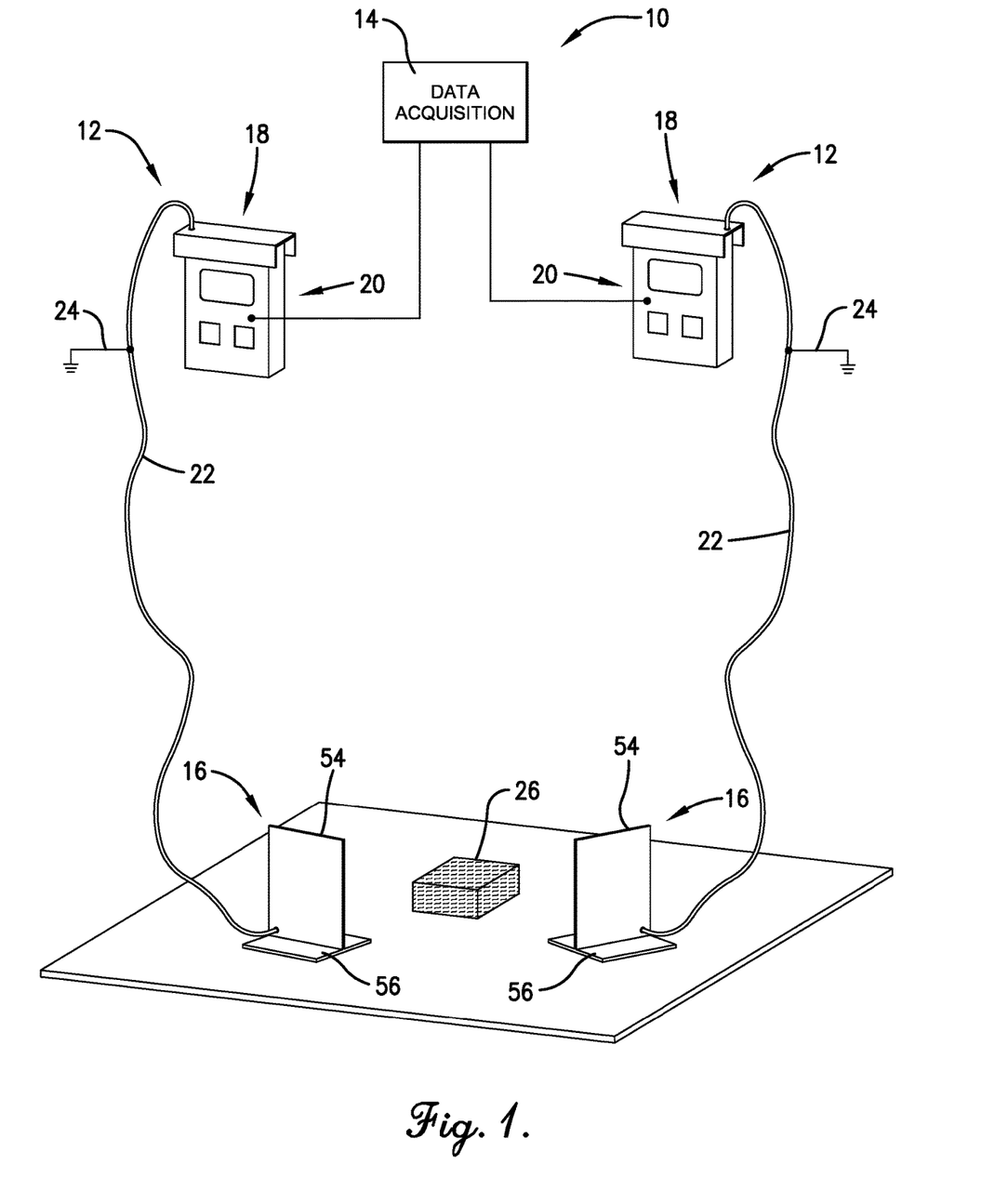
FIG. 1 is a perspective environmental view of a system, constructed in accordance with various embodiments of the current invention, for monitoring electrostatic charge buildup and electrostatic discharge remotely.

Referring to FIG. 1, a system 10, constructed in accordance with various embodiments of the current invention, for monitoring electrostatic charge buildup and electrostatic discharge (ESD) remotely is shown. The system 10 broadly comprises a plurality of electrostatic charge measurement units 12 and a data acquisition device 14. Each electrostatic charge unit 12 includes a primary charge plate 16, a secondary charge plate 18, a static sensor device 20, a shielded cable 22, and a grounding cable 24. The system 10 is utilized to monitor electric charge buildup or ESD in or on an object 26 that is not in a close vicinity of the static sensor devices 20. Thus, the system 10 can monitor ESD or electric charge buildup in areas where it is not permitted or is not practical to position the static sensor devices 20.

The primary charge plate 16 includes a sensing plate 54 and a base 56. The sensing plate 54 is formed from electrically conductive material, such as metals and/or metal alloys. The sensing plate 54 is typically quadrilateral shaped, includes a front surface and a back surface, and has a thickness that is small compared to its surface area. The base 56 is formed from electrically insulating or dielectric materials, such as polymers or the like. The base 56 is coupled to a lower edge of the sensing plate 54 and holds the sensing plate 54 upright. The sensing plate 54 may include one or more electrical connectors or adapters to which cables may be attached.

Figure 2:
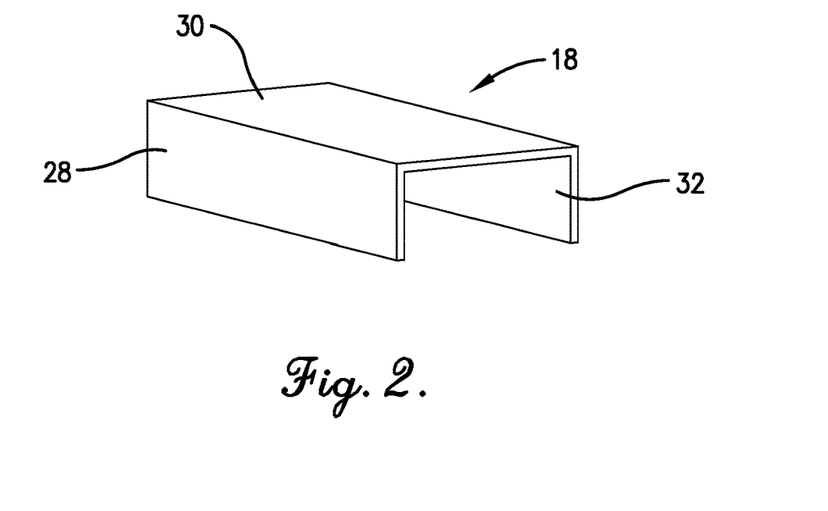
FIG. 2 is perspective view of a secondary charge plate that is a component of the system.

The secondary charge plate 18 is formed from electrically conductive material, such as metals and/or metal alloys. The secondary charge plate 18 is relatively thin and may include a plurality of sections that form a front wall 28, a top wall 30, and a rear wall 32, as shown in FIG. 2. The secondary charge plate 18 may include one or more electrical connectors or adapters to which cables may be attached. In some embodiments, the surfaces of the front wall 28, the top wall 30, and the rear wall 32 may be covered with an insulating or dielectric film, such as Kapton tape.

Figure 3:
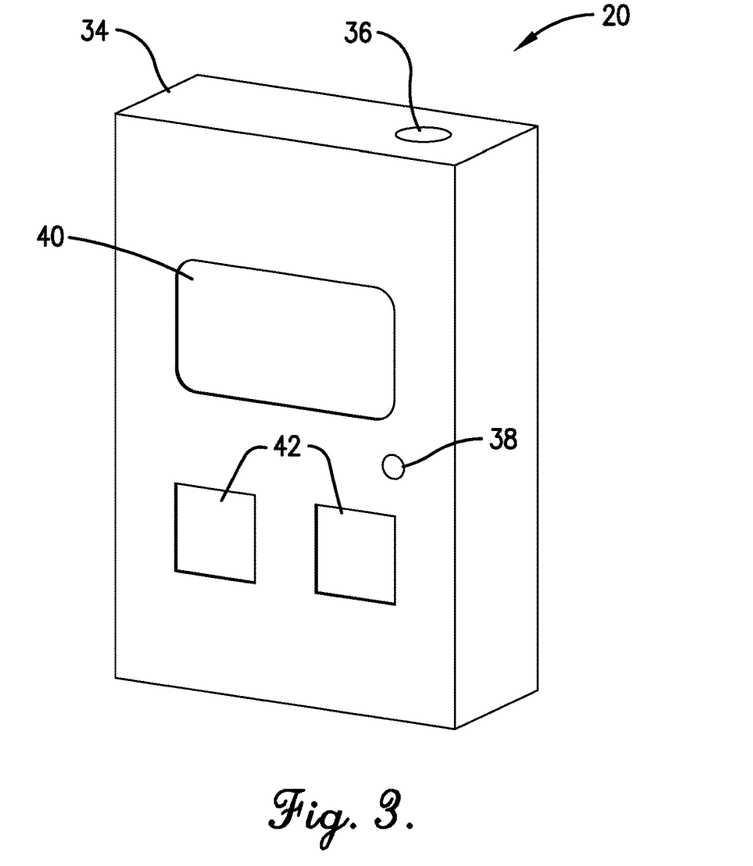
FIG. 3 is a front view of a static sensor device that is a component of the system.
Figure 4:
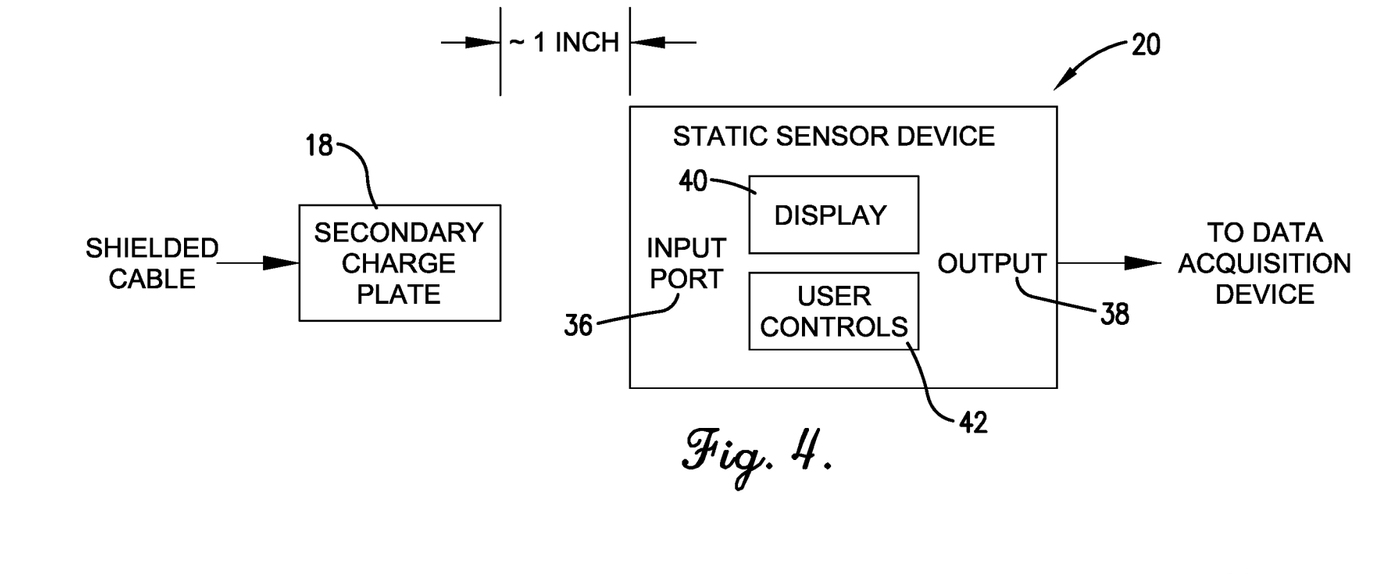
FIG. 4 is a schematic block diagram of components of the system including a secondary charge plate and a static sensor device.

The static sensor device 20 includes a housing 34, an input sensor 36, an output 38, a display 40, and user controls 42, as shown in FIGS. 3 and 4. An electric voltage is measured at the input sensor 36. The static sensor device 20 also includes sensors and/or electric circuitry (not shown in the figures) to determine electric voltage or electric field strength. The secondary charge plate 18 is physically attached to the housing 34 with electrically insulated spacers such that the top wall 30 of the secondary charge plate 18 is positioned approximately 1 inch away from the input sensor 36. The output 38 outputs a static sensor electronic signal whose level varies according to the measured electric voltage. The display 40 displays values of electric voltage or electric field strength. The user controls 42 allow users to adjust settings. An exemplary static sensor device 20 may include or be embodied by a model 282A electrostatic field meter from Monroe Electronics of Lyndonville, N.Y.

Figure 5:
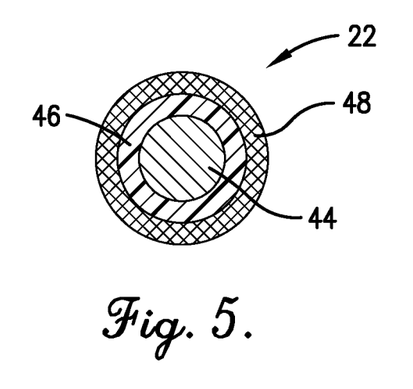
FIG. 5 is a cross-sectional view of a shielded cable that is a component of the system.

The shielded cable 22 includes an inner conductor 44, a first insulator 46, and an outer conductor 48. The shielded cable 22 may optionally include a second insulator. The inner conductor 44 and the outer conductor 48 are each formed from electrically conductive materials, such as metals and/or metal alloys. The first insulator 46 and the optional second insulator are each formed from electrically insulating or dielectric materials, such as polymers or the like. As shown in FIG. 5, the inner conductor 44, which may be single stranded or multi stranded, is positioned along a central axis of the shielded cable 22. The first insulator 46 surrounds the inner conductor 44. The outer conductor 48, which may be multi stranded, braided, or foil, is radially spaced apart from, and surrounds, the first insulator 46. If a second insulator is included, then it surrounds the outer conductor 48. The shielded cable 22 may include a first electrical connector coupled to the inner conductor 44 at a first end and a second electrical connector coupled to the inner conductor 44 at a second, opposing end. In addition, the shielded cable 22 is characterized, or measured, to determine its resistance or a voltage drop from the first end to the second end that occurs during usage. Furthermore, the shielded cable 22 may have a length ranging from several feet to tens of feet.

Figure 6:
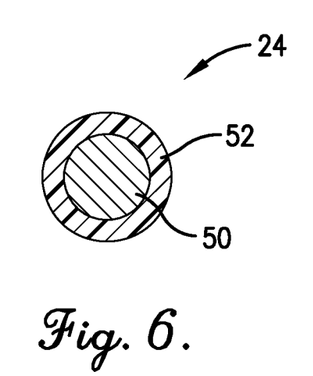
FIG. 6 is a cross-sectional view of a grounding cable that is a component of the system.

Referring to FIG. 6, the grounding cable 24 includes an inner conductor 50, formed from single stranded or multi stranded electrically conductive materials, and an insulator 52, formed from electrically insulating materials, which surrounds the inner conductor 50. The grounding cable 24 may include a first electrical connector coupled to the inner conductor 50 at a first end and a second electrical connector coupled to the inner conductor 50 at a second, opposing end. The electrical connectors may include alligator or other clamping connectors.

The data acquisition device 14 generally analyzes and stores data. The data acquisition device 14 includes a plurality of inputs, each input configured to receive an analog electric voltage signal. The data acquisition device 14 may also include electric circuitry configured to perform sampling, analog-to-digital conversion (ADC), and the like. The data acquisition device 14 may further include, or be in electronic communication with, displays for displaying information or printers for printing information. The data acquisition device 14 may record the electric voltage level over time of each input signal and perform analysis to monitor changes and warn of pending ESD events.

Components of the each electrostatic charge measurement unit 12 may be connected as follows. The sensing plate 54 of the primary charge plate 16 is electrically connected to the first end of the inner conductor 44 of the shielded cable 22. The second end of the inner conductor 44 of the shielded cable 22 is electrically connected to the secondary charge plate 18. And, the secondary charge plate 18 is physically connected to the housing 34 of the static sensor device 20 such that the top wall 30 is approximately 1 inch from the input sensor 36. In the vicinity of the second end of the shielded cable 22, the first end of the inner conductor 50 of the grounding cable 24 is electrically connected to the outer conductor 48 of the shielded cable 22. The second end of the inner conductor 50 of the grounding cable 24 is electrically connected to electrical ground. The output 38 of the static sensor device 20 is electrically connected to one of the inputs of the data acquisition device 14.

The system 10 may operate as follows. As shown in FIG. 1, the primary charge plates 16 are positioned so that each sensing plate 54 is located within a few inches or less of the object 26 experiencing, or about to experience, a change in electrostatic charge level. Typically, each primary charge plate 16 is positioned such that the front surface of the sensing plate 54 faces the object 26. In some instances, the object 26 may be positioned in an isolation or blasting chamber. Thus, the primary charge plates 16 are positioned in the chamber as well, and the shielded cables 22 are extended through openings in the chamber. The static sensor devices 20 and the secondary charge plates 18 are positioned an appropriate distance away from the object 26 (and outside the chamber, if a chamber is used)—generally much farther away from the object 26 than the primary charge plates 16. A buildup of electrostatic charge around, in, or on the object 26 generates a field which induces or develops a primary electric voltage on the sensing plate 54 of one or more of the primary charge plates 16. In response, a secondary electric voltage occurs on the associated secondary charge plates 18, wherein the secondary electric voltage is proportional to, corresponds to, and/or varies according to, the primary electric voltage. Each associated static sensor device 20 measures the secondary electric voltage and outputs the static sensor electronic signal, whose level varies according to the secondary electric voltage. The data acquisition device 14 receives each of the static sensor electronic signals, converts the level to a digital data value, and may adjust the value to account for the voltage drop across the associated shielded cable 22. Thus, the data acquisition device 14 may record and analyze values that more accurately reflect the primary electric voltages experienced by the sensing plates 54.

Figure 7:
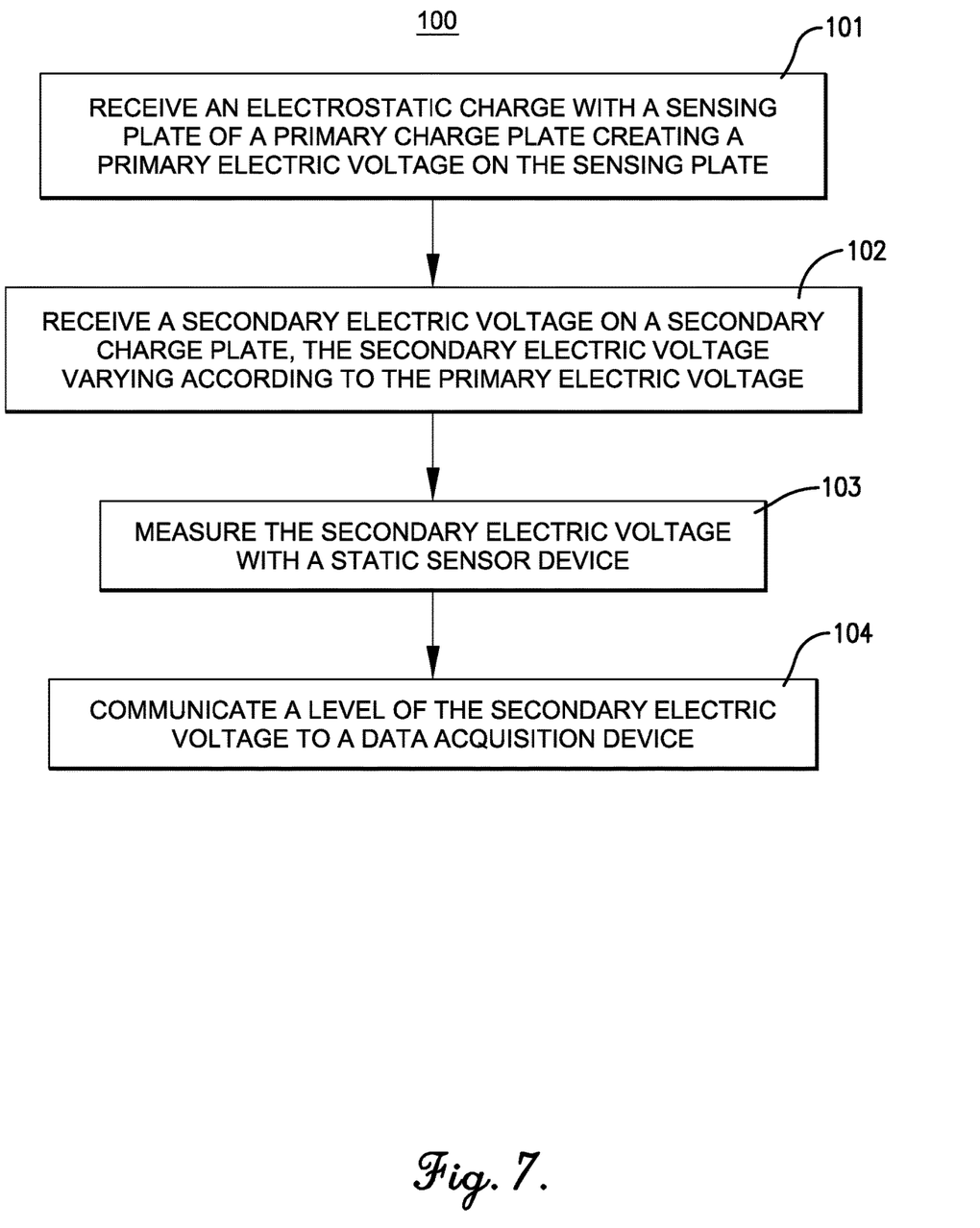
FIG. 7 is a listing of at least a portion of the steps of a method for monitoring electrostatic charge buildup and electrostatic discharge remotely.

FIG. 7 depicts a listing of at least a portion of the steps of an exemplary method 100 for monitoring electrostatic charge buildup and electrostatic discharge (ESD) remotely. The steps may be performed in the order shown in FIG. 7, or they may be performed in a different order. Furthermore, some steps may be performed concurrently as opposed to sequentially. In addition, some steps may be optional or may not be performed. The steps may be performed utilizing components of the system 10.

Referring to step 101, an electrostatic charge is received with a sensing plate 54 of a primary charge plate 16 creating a primary electric voltage on the sensing plate 54. The primary charge plate 16 is positioned in proximity to, and at a first distance from, an object 26 to be monitored for changes in electrostatic charge, as shown in FIG. 1. The primary charge plate 16 is a component of one of a plurality of electrostatic charge measurement units 12. Thus, more than one primary charge plate 16 may be utilized. In addition, the primary charge plate 16 includes a front surface and an opposing back surface. The primary charge plate 16 is positioned such that the front surface faces the object 26.

Referring to step 102, a secondary electric voltage is received on a secondary charge plate 18, the secondary electric voltage varying according to the primary electric voltage. The secondary charge plate 18 is positioned at a second distance from the object 26, wherein the second distance is greater than the first distance. The secondary charge plate 18 is electrically connected to sensing plate 54 of the primary charge plate 16 through an inner conductor 44 of a shielded cable 22, which provides electronic communication, or electric coupling, between the sensing plate 54 and the secondary charge plate 18. An outer conductor 48, radially spaced apart from the inner conductor 44 by a first insulator 46, of the shielded cable 22 is electrically connected to electrical ground.

Referring to step 103, the secondary electric voltage is measured with a static sensor device 20. The static sensor device 20 includes an input sensor 36 at which the electric voltage is measured. The secondary charge plate 18 is physically connected to a housing 34 of the static sensor device 20 such that at least a portion of the secondary charge plate 18 is positioned in front of the input sensor 36.

Referring to step 104, a level of the secondary electric voltage is communicated to a data acquisition device 14. The static sensor device 20 includes an output 38 which outputs an electronic signal whose level varies according to the measured input electric voltage. The data acquisition device 14 receives the electronic signal, samples the electronic signal, converts the samples into digital data values, and may adjust the digital data values to account for losses in the shielded cable 22. The data acquisition device 14 may also store and analyze the digital data values.

ADDITIONAL CONSIDERATIONS

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A system for monitoring electrostatic charge buildup and electrostatic discharge (ESD) remotely, the system comprising:
   a plurality of electrostatic charge measurement units, each electrostatic charge measurement unit including:
      a primary charge plate including a sensing plate formed from electrically conductive material and configured to be positioned at a first distance from an object to be monitored for changes in electrostatic charge, and to develop a primary electric voltage in response to the electrostatic charge of the object,
      a secondary charge plate formed from electrically conductive material, the secondary charge plate configured to develop a secondary electric voltage which varies according to the primary electric voltage,
      a static sensor device including an input sensor at which the secondary electric voltage is measured, the static sensor device configured to output an electronic signal which varies according to the measured secondary electric voltage, and
      a shielded cable including an inner electrical conductor electrically connected to the primary charge plate and the secondary charge plate and a radially spaced apart outer electrical conductor electrically connected to electrical ground; and
   a data acquisition device configured to receive the electronic signal from the static sensor device of each electrostatic charge measurement unit.

2. The system of claim 1, wherein each electrostatic charge measurement unit further includes a grounding cable including an electrical conductor electrically connecting the outer electrical conductor of the shielded cable to electrical ground.

3. The system of claim 1, wherein the sensing plate includes a front surface and an opposing back surface, and the front surface is configured to face the object.

4. The system of claim 1, wherein the static sensor device further includes a housing and the secondary charge plate is physically attached to the housing of the static sensor device.

5. The system of claim 1, wherein the secondary charge plate is configured to be positioned at a second distance from the object, the second distance being greater than the first distance.

6. A system for monitoring electrostatic charge buildup and electrostatic discharge (ESD) remotely, the system comprising:
   a plurality of electrostatic charge measurement units, each electrostatic charge measurement unit including:
      a primary charge plate including
         a sensing plate formed from electrically conductive material and having a front surface and an opposing back surface, and
         a base formed from electrically insulating material and connected to a lower edge of the sensing plate, the sensing plate configured to be positioned at a first distance from an object to be monitored for changes in electrostatic charge with the front surface facing the object, and to develop a primary electric voltage in response to the electrostatic charge of the object,
      a secondary charge plate formed from electrically conductive material, the secondary charge plate configured to be positioned at a second distance from the object, the second distance greater than the first distance, and to develop a secondary electric voltage which varies according to the primary electric voltage,
      a static sensor device including a housing and an input sensor at which the secondary electric voltage is measured, the static sensor device configured to output an electronic signal which varies according to the measured secondary electric voltage,
      a shielded cable including an inner electrical conductor electrically connected to the primary charge plate and the secondary charge plate and a radially spaced apart outer electrical conductor, and
      a grounding cable including an inner electrical conductor electrically connected to the outer electrical conductor of the shielded cable and to electrical ground; and
   a data acquisition device configured to receive the electronic signal from the static sensor device of each electrostatic charge measurement unit.

7. A method for monitoring electrostatic charge buildup and electrostatic discharge (ESD) remotely, the method comprising:

receiving an electrostatic charge with a sensing plate of a primary charge plate that creates a primary electric voltage on the sensing plate, the electrostatic charge generated by an object to be monitored for changes in electrostatic charge;

receiving a secondary electric voltage on a secondary charge plate, the secondary electric voltage varying according to the primary electric voltage;

measuring the secondary electric voltage with a static sensor device; and communicating a level of the secondary electric voltage to a data acquisition device.

8. The method of claim 7, further comprising providing electronic communication between the sensing plate and the secondary charge plate with a shielded cable.

9. The method of claim 7, wherein the sensing plate is positioned at a first distance from the object.

10. The method of claim 9, wherein the secondary charge plate is positioned at a second distance from the object, the second distance being greater than the first.

11. The system of claim 6, wherein the secondary charge plate is physically attached to the housing of the static sensor device in proximity to the input sensor.

\* \* \* \* \*